(12) United States Patent
Tran

(10) Patent No.: US 7,285,846 B1
(45) Date of Patent: Oct. 23, 2007

(54) INTEGRATED CIRCUIT PACKAGE WITH ESD PROTECTION

(75) Inventor: Vincent MinhTu Tran, Arlington, TX (US)

(73) Assignee: Littelfuse, Inc., Des Plaines, IL (US)

( * ) Notice: Subject to any disclaimer, the term of this patent is extended or adjusted under 35 U.S.C. 154(b) by 160 days.

(21) Appl. No.: 11/062,527

(22) Filed: Feb. 22, 2005

(51) Int. Cl.
*H01L 23/495* (2006.01)
(52) U.S. Cl. .................. 257/667; 257/666; 438/123
(58) Field of Classification Search ................ 257/667, 257/666; 438/123, 124
See application file for complete search history.

(56) References Cited

U.S. PATENT DOCUMENTS

| | | | |
|---|---|---|---|
| 4,043,027 A | 8/1977 | Birchler et al. | |
| 4,097,834 A | 6/1978 | Mar et al. | |
| 4,726,991 A | 2/1988 | Hyatt et al. | |
| 4,977,357 A | 12/1990 | Shrier | |
| 5,262,754 A | 11/1993 | Collins | |
| 5,796,570 A * | 8/1998 | Mekdhanasarn et al. | 361/126 |
| 5,955,762 A | 9/1999 | Hively | |
| 5,970,321 A * | 10/1999 | Hively | 438/123 |
| 6,049,120 A * | 4/2000 | Otani et al. | 257/667 |
| 6,191,928 B1 | 2/2001 | Rector et al. | |
| 6,211,554 B1 | 4/2001 | Whitney | |
| 6,351,011 B1 * | 2/2002 | Whitney et al. | 257/355 |
| 6,508,970 B2 | 1/2003 | Chandra | |
| 6,544,816 B1 | 4/2003 | Lim et al. | |
| 6,549,114 B2 | 4/2003 | Whitney et al. | |
| 6,628,498 B2 | 9/2003 | Whitney et al. | |
| 6,693,508 B2 | 2/2004 | Whitney et al. | |

* cited by examiner

*Primary Examiner*—Roy Potter
(74) *Attorney, Agent, or Firm*—Roger N. Chauza

(57) ABSTRACT

A semiconductor chip is attached to bifurcated finger members of a lead frame. A pocket is formed between the semiconductor chip and the lead frame. An opening is formed between the bifurcated fingers for injecting into the pocket a voltage variable material to provide electrostatic discharge protection to circuits connected to the lead frame.

23 Claims, 5 Drawing Sheets

INTEGRATED CIRCUIT PACKAGE WITH ESD PROTECTION

TECHNICAL FIELD OF THE INVENTION

The present invention relates in general to methods and apparatus for providing ESD protection to electronic circuits, and more particularly to the use of voltage material with a lead frame of an integrated circuit.

BACKGROUND OF THE INVENTION

Electronic circuits and components are prone to damage when subjected to electrostatic discharges, commonly known as ESD. The accumulation of an electrostatic charge can be generated by rubbing insulators together, such as by a person walking, by air currents, etc. The voltage of an electrostatic charge can range from several hundred volts to several thousand volts. When an integrated circuit is subjected to an electrostatic discharge, the voltage and duration is often sufficient to damage semiconductor junctions, thereby rendering circuits unable to function. Capacitors and other components can also be damaged by the voltage of an electrostatic discharge. The current of an electrostatic discharge generally finds a path through the damaged component to a circuit ground or other reference voltage or line.

Because of the potential for damage to electronic circuits by electrostatic discharges, many designs incorporate therein circuits specially designed to short circuit the electrostatic discharge energy to circuit ground and thereby protect the other circuits of the chip or printed circuit board. In practice, the input/output pins of an integrated circuit often include special ESD protection circuits. In addition, the input/output pins of most types of equipment incorporating electronic circuits, such as computers, digital cameras, facsimile machines, printers, etc., provide special ESD protection circuits.

ESD protection circuits may include one or more transistors dedicated to the sensing of ESD voltages and the short circuiting thereof to ground. ESD circuits can also be embodied in discrete components connected between the I/O pins of a circuit board, or the like, and ground. Active components, such as transistors and various types of diodes which clamp the electrostatic voltage to safe levels can be utilized to provide protection against the effects of ESD. ESD protection can be provided by miniature two-terminal devices having a small gap that arcs across when subjected to electrostatic voltages. In addition to a host of other ESD protection devices; a recent emphasis has been placed on the use of voltage materials (VVM) as an ESD protection mechanism. The following patents relate to the use of VVM with integrated circuits to protect the same from the harmful effects of ESD: U.S. Pat. No. 6,693,508 by Whitney et al; U.S. Pat. No. 6,549,114 by Whitney et al; U.S. Pat. No. 6,351,011 by Whitney et al and U.S. Pat. No. 6,211,554 by Whitney.

The voltage variable material can be made using a polymer having finely divided particles dispersed in an organic resin or an insulating medium. The polymeric material consists of conductive particles which are uniformly dispersed throughout the insulating binder. The voltage variable material exhibits a nonlinear resistance characteristic, in that when exposed to low voltages it is highly resistive, and when exposed to electrostatic-type voltage magnitudes, the resistance lowers very quickly. The material also exhibits a very low capacitance, thereby making it compatible for use in protecting high speed digital circuits. Voltage variable materials are disclosed in U.S. Pat. No. 6,191,928 by Rector, et al, the disclosure of which is incorporated herein by reference. Other patents disclosing voltage variable materials include U.S. Pat. Nos. 4,097,834; 4,726,991; 4,997,357; 5,262,754 and 5,955,762.

Attempts have been made to incorporate the voltage variable material into integrated circuits during fabrication of the die. While this technique may be acceptable in terms of the desired end result, it complicates the process by requiring the procedure to be carried out in the clean room environment. In addition, any adverse long term effects of the various polymer materials on the semiconductor material cannot be ascertained to a high degree.

From the foregoing, it can be seen that a need exists to efficiently incorporate ESD protection within a packaged integrated circuit, using voltage variable materials. Another need exists for the use of voltage variable material in conjunction with integrated circuit lead frames, subsequent to the clean room processing stage. Yet another need exists for a technique to integrate VVM in the integrated circuit package subsequent to fabrication of the die, but prior to the encapsulation.

SUMMARY OF THE INVENTION

In accordance with the principles and concepts of the invention, there is disclosed a packaged device comprising a semiconductor chip attached to a lead frame, and where a voltage variable material is placed in a pocket formed between the semiconductor chip and the lead frame. p In accordance with one feature of the invention, the lead frame is constructed with bifurcated fingers to which the semiconductor chip is attached. The bifurcated fingers of the lead frame are spaced apart with a slot which is filled with the voltage variable material.

In accordance with another feature of the invention, an opening is formed in the slot so that the voltage variable material can be injected therethrough into the pocket former between the semiconductor chip and the lead frame.

In accordance with another aspect of the invention, the voltage variable material is injected into the pocket to thereby make physical and electrical contact not only between the bifurcated fingers of the lead frame, but also between the contacts of the semiconductor chip.

In accordance with yet another feature of the invention, the voltage variable material is substantially hidden in the pocket so as not to be exposed to the encapsulant during the encapsulating process. This minimal contact between the voltage variable material and the encapsulant minimizes the possibility that the encapsulant will dislodge the VVM or compromise its contact with the lead frame.

In accordance with another embodiment, disclosed is a packaged device comprising a lead frame having members providing a first terminal and a second terminal to the packaged device. Included is a component mounted to the lead frame, where the lead frame has an opening therein. A pocket is formed between the component and the lead frame, and the pocket is larger than the opening. The opening is in communication with the pocket. A voltage variable material is injected into the pocket via the opening. The voltage variable material is adapted for providing electrostatic discharge protection to circuits connected to the first and second terminals of the packaged device.

According to another embodiment, disclosed is a packaged device comprising a semiconductor chip having at least two contacts; a voltage variable material adapted for providing electrostatic discharge protection to circuits connected to the packaged device, and a lead frame having two elongated members, where each elongate member has an outer defining a terminal of the packaged device for connection to other circuits, and each elongate member has an inner end for connection to a respective semiconductor chip contact. The inner ends of the respective elongate members define respective fingers. Each lead frame finger has a width about one half a respective width of the terminals, and each lead frame finger is spaced apart from each other by a slot. The slot has an opening for dispensing therethrough a liquefied form of the voltage variable material. The voltage variable material fills a space formed by the semiconductor chip and the lead frame.

According to yet another embodiment of the invention, disclosed is a method of making a packaged device. The method comprises the steps of fastening a semiconductor chip to a lead frame and injecting a voltage variable material through an opening in the lead frame into a pocket formed between the semiconductor chip and the lead frame. The voltage variable material is of the type providing electrostatic discharge protection to circuits connected to the lead frame. The semiconductor chip and a portion of the lead frame are encapsulated with a moldable material in such a manner that the moldable material contacts the voltage variable material only in the opening in the lead frame.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts, functions or elements throughout the views, and in which.

DETAILED DESCRIPTION OF THE INVENTION

Figure 1:
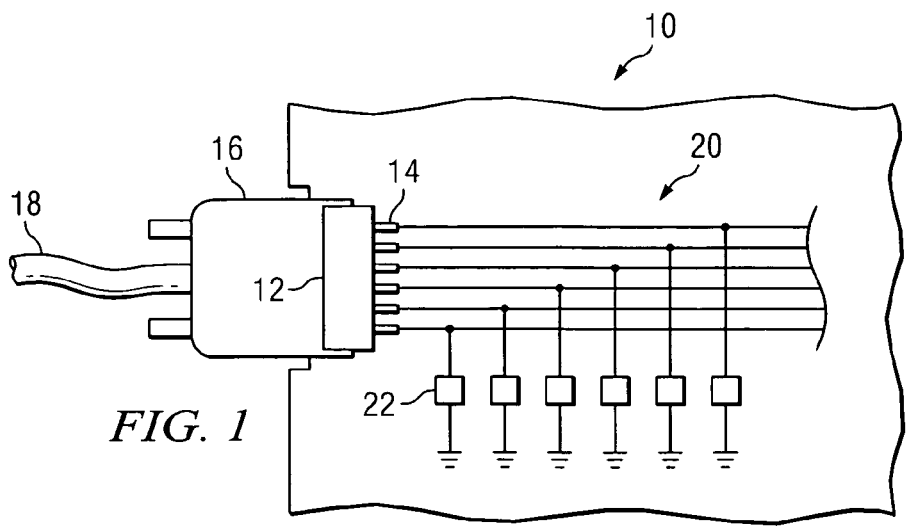
FIG. 1 illustrates an environment in which the invention can be advantageously practiced.

With reference to FIG. 1, there is shown a portion of an electronic apparatus 10, such as a computer, printer, etc., employing a connector socket 12 with a number of I/O receptacles 14. A connector plug 16 has a corresponding number of pins (not shown) mating with the receptacles 14 of the socket 12. A multi-conductor cable 18 is connected to the individual conductors 20 of the electronic equipment 10 via the connector plug 16 and socket 12.

In order to protect the electronic circuits (not shown) associated with the electronic equipment 10 from potential damage as a result of electrostatic discharge, each conductor 20 is connected to a respective ESD protection device, one shown as reference numeral 22. While not shown, other devices can be employed to protect the conductors 20 against the harmful effects of lightning or other similar types of high energy strikes thereto. Preferably, the ESD protection devices 22 are located as close as possible to the connector socket 12. In the event that an electrostatic discharge is coupled to any one or more of the conductors 20, the associated ESD device 22 will quickly transcend from a high resistance state to a low resistance state to thereby short circuit such energy to ground. This protects the electronic circuits connected down line to the conductors 20. After the electrostatic energy has been dissipated, the ESD protection devices 22 return to the high resistance states, whereupon the electronic equipment 10 proceeds with normal operation.

In accordance with the principles and concepts of the invention, the ESD protection devices 22 incorporate protection against both ESD and high energy lightning strikes. According to another feature of the invention, the mechanism for providing ESD protection is a voltage variable material incorporated into the lead frame of a SIDACtor® overvoltage protection device 30. The overvoltage protection device 30 is especially adapted for providing protection against high energy lightning strikes, and the like.

Figure 2:
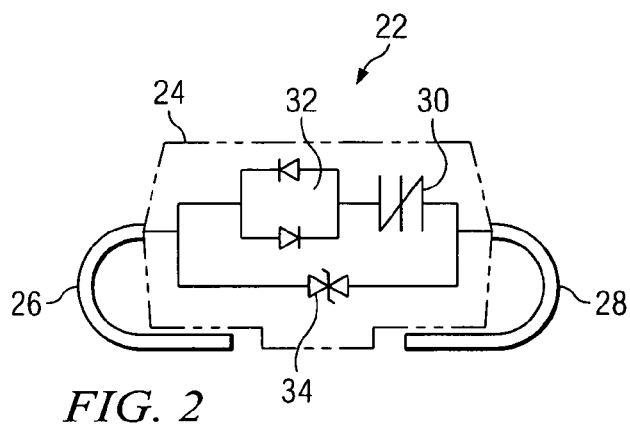
FIG. 2 shows in simplified form an integrated circuit package incorporating a SIDACtor® overvoltage protection device and voltage variable material functioning as protection against electrostatic discharges.
Figure 3:
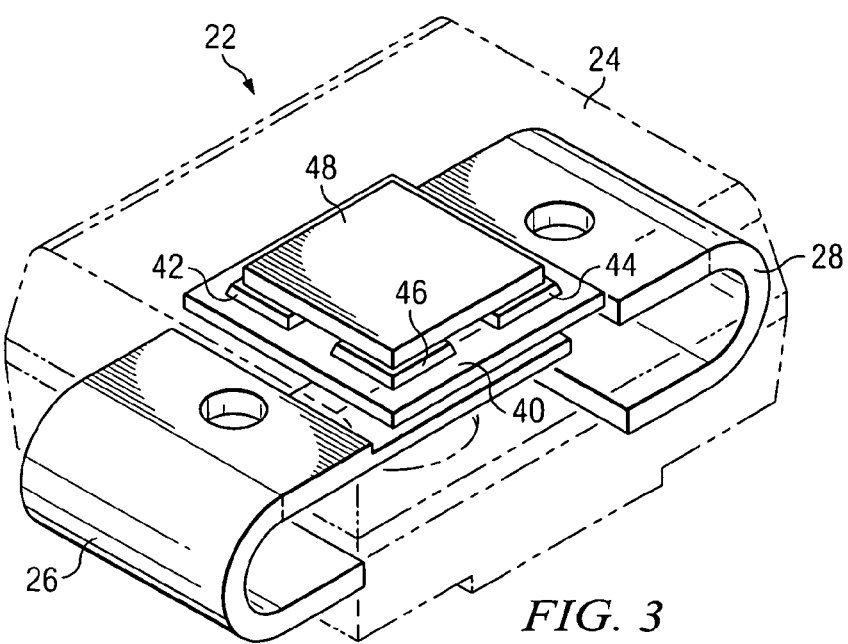
FIG. 3 is an isometric view of an integrated circuit package showing the internal structural details.
Figure 4:
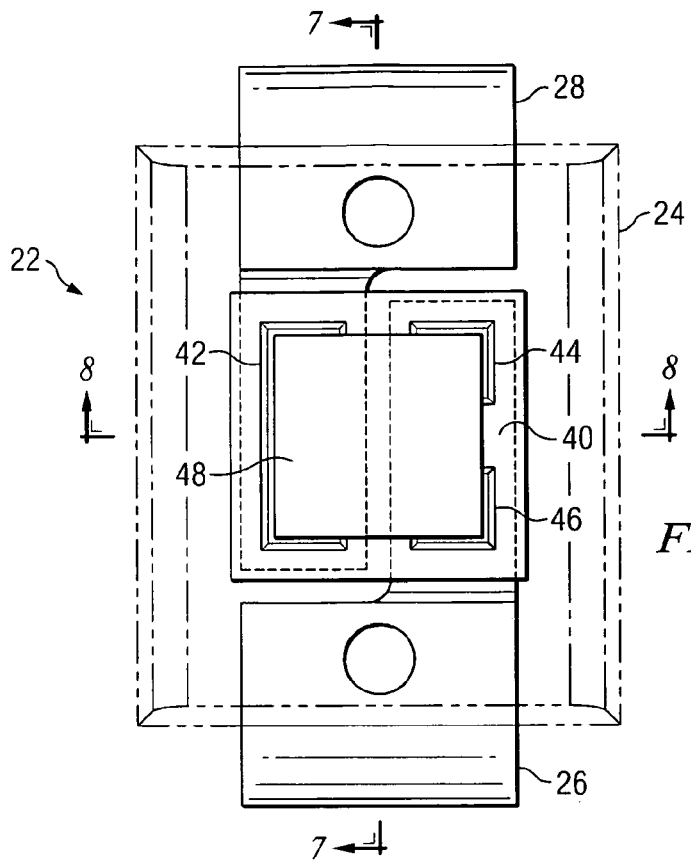
FIG. 4 is a top view of the integrated circuit package of FIG. 3.
Figure 5:
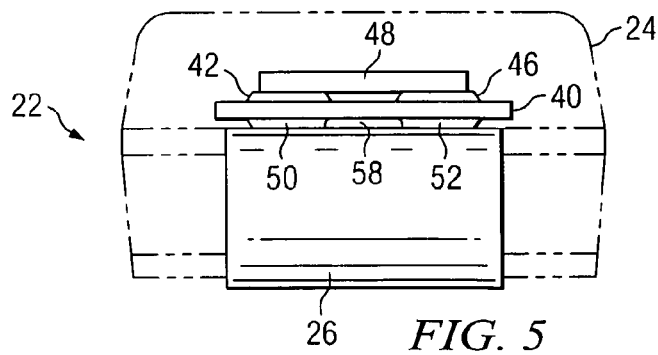
FIG. 5 is an end view of the integrated circuit package of FIG. 3.
Figure 6:
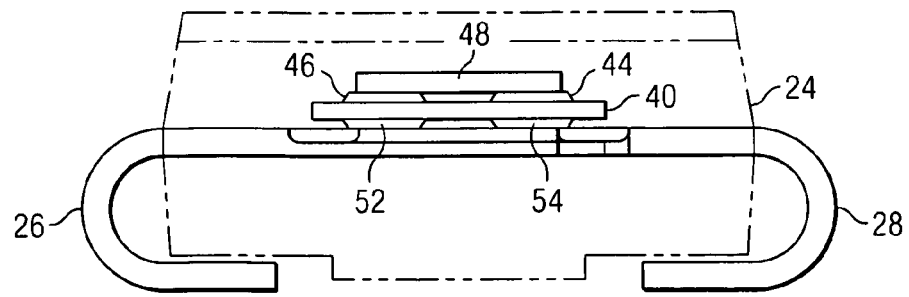
FIG. 6 is a side view of the integrated circuit package of FIG. 3.

FIG. 2 illustrates in simplified form a packaged integrated circuit device 22 well adapted for use in the environment depicted in FIG. 1. The integrated circuit package 22 includes a body formed of an encapsulation material 24, and a lead frame providing a first connection terminal 26 and a second connection terminal 28. The package configuration shown is typical of the DO-214 type. Packaged within the encapsulating material 24 is a SIDACtor® overvoltage protection device 30 available from Teccor Electronics, Inc., of Irving, Tex. The overvoltage protection device 30 provides a short circuit between the terminals 26 and 28 in response to high energy lightning strikes (of either polarity) on the lines 20. A pair of parallel-connected and oppositely-polled diodes 32 is connected in series with the overvoltage protection device 30 to reduce the overall capacitance of the overvoltage protection device 30. The integrated circuit package 22 is thus well adapted for operation with high-speed digital lines. To that end, the overvoltage protection device 30 can be obtained with breakover voltages ($V_{BO}$) as low as 3.3 volts. However, the integrated circuit package 22 can be fabricated to provide overvoltage protection to electrical lines 20 that are capable of carrying a large range of other digital or analog voltages. In the description which ensues below, it should be appreciated that the feature of using voltage variable material with a lead frame can be employed in many other types of integrated circuits.

Connected between the terminals 26 and 28 of the integrated circuit package 22 is a device 34 providing protection against electrostatic discharges. Preferably, the ESD protection device 34 is responsive to voltages of either polarity to thereby create a very low resistance between the device terminals 26 and 28. As will be described in more detail below, the ESD protection device 34 comprises a voltage variable material in physical contact with the terminals 26 and 28 of the lead frame of the integrated circuit package 22. When an electrostatic discharge voltage exists between the device terminals 26 and 28, the VVM quickly transcends to a low resistance state to thereby short circuit the harmful voltage to ground. After the ESD has been dissipated, the VVM returns to a high resistance state. The VVM does not degrade over time or after a number of operations, thus making it highly desirable for use in reliably protecting electronic circuits and components.

As used herein, the term "electrostatic discharge" or "ESD" encompasses a broader range of electrical overstresses, including but not limited to electrostatic discharges, indirect lightning discharges, human and structural discharges, and electromagnetic pulse discharges. These types of electrostatic discharges can be routed to ground through voltage variable material described in various prior art patents, including U.S. Pat. Nos. 4,097,834; 4,726,991; 4,977,357; 5,262,754 and 5,955,762. In the preferred embodiment of the invention, used is a voltage variable material identified as type 4501-WPM, obtainable from Littelfuse, Des Palines, Ill. This type of voltage variable material is initially in a paste form. It can be applied to surfaces and cured at a specified temperature, whereupon the voltage variable material becomes hardened. As noted above, this material has a characteristic low capacitance, and thus is well adapted for use with lines or conductors carrying high speed signals, in the GHz range.

FIGS. 3-6 illustrate the various features of the integrated circuit package 22 of FIG. 2. The overvoltage protection device 30 and associated diodes 32 are formed in a semiconductor chip 40. One contact 42 (rectangular-shaped) of the chip 40 is associated with the overvoltage protection device 30, and respective chip contacts 44 and 46 (square-shaped) are associated with the diodes 32. The chip contacts 42, 44 and 46 are all short circuited together by a metallic preform 48. The preform 48 is preferably constructed of copper and soldered to the three chip contacts 42, 44 and 46.

A group of three contacts are similarly formed on the opposite side of the semiconductor chip 40. A rectangular-shaped overvoltage protection device contact 50 is formed on the bottom of the chip 40. In like manner, a pair of square-shaped diode contacts 52 and 54 are formed on the bottom of the chip 40. A first lead frame terminal 26 is electrically connected to the pair of square diode contacts 52 and 54 located on the bottom of the semiconductor chip 40. The outline of the inner portion of the lead frame terminal 26 is shown in broken line in FIG. 4. A second lead frame terminal 28 is electrically connected to the rectangular-shaped chip contact 50. The outline of the inner portion of the lead frame terminal 28 is shown in broken line in FIG. 4. The semiconductor chip 40 and associated components, as well as the inner portions of the lead frame terminals are encapsulated with an epoxy type material 24. Preferably, but not by way of necessity, the encapsulation process is carried out by placing the lead frame and semiconductor chip 40 attached thereto in a mold, and then forcing the liquefied encapsulant therein until all of the void space in the mold is filled. After the encapsulating material has been cured, the mold is removed and the lead frame is cut. As can be appreciated, any type of encapsulation material suitable for use with integrated circuits can be employed.

Because of the construction of the lead frame, and because of the bidirectional current carrying capability of both the overvoltage protection circuit 30 and the diode pair 32, the chip 40 can be rotated 180 degrees during assembly and still function for its intended purpose.

Also encapsulated with the semiconductor chip 40 is a voltage variable material 58 that physically contacts the lead frame terminals 26 and 28. This is clearly shown in the cross-sectional vies of FIGS. 7 and 8. The voltage variable material 58 provides protection against the harmful effects of electrostatic voltages applied between the lead frame terminals 26 and 28.

Figure 9:
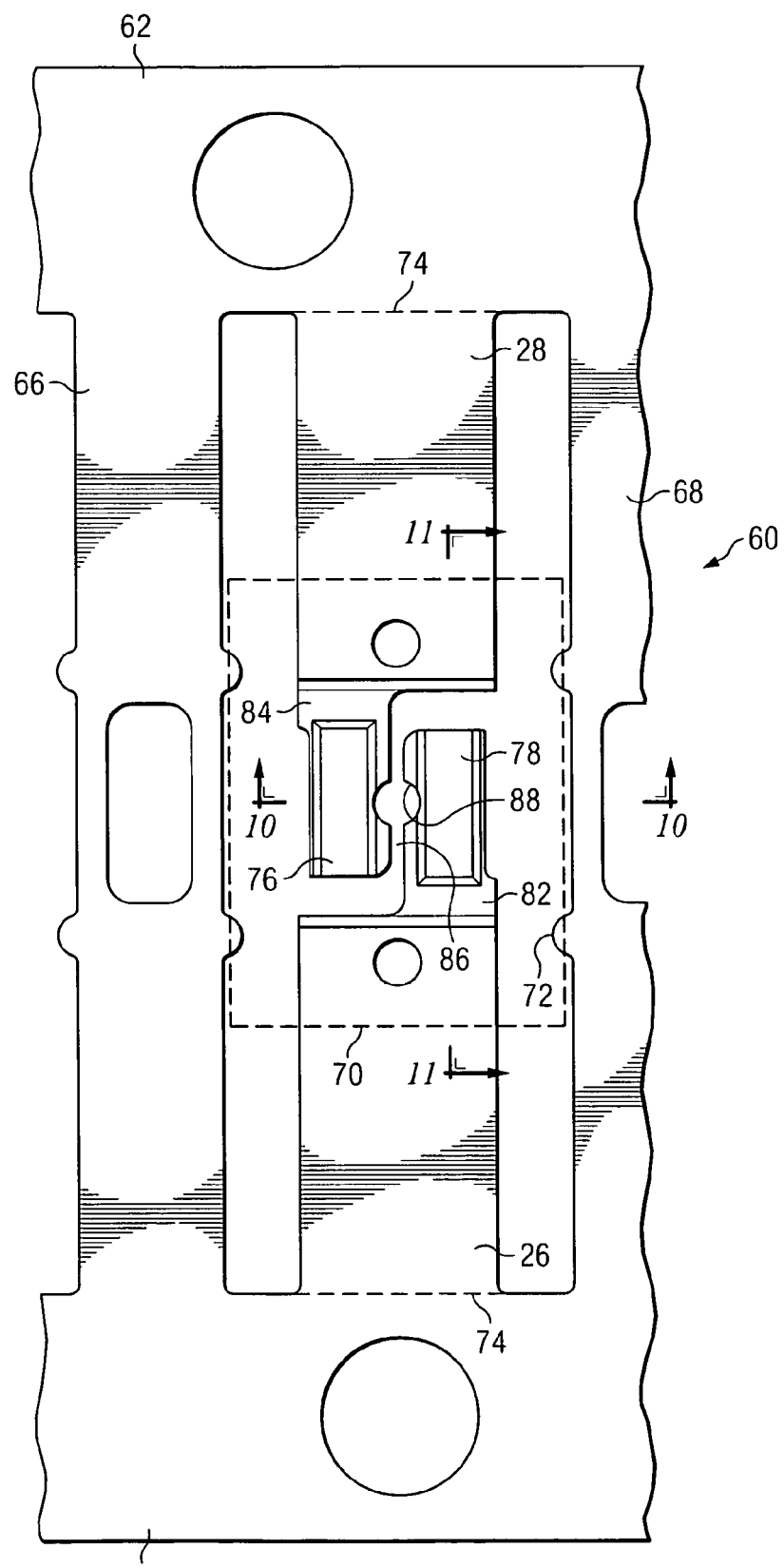
FIG. 9 is a top view of a portion of a lead frame constructed according to the invention, showing in detail the bifurcated fingers.

In order to facilitate the understanding of the placement of the voltage variable material 58 in the integrated circuit package 22, reference is made to the construction of the lead frame 60 shown in FIGS. 9-12. A portion of a lead frame 60 is shown in FIG. 9, it being understood that lead frames are generally constructed in a strip so that multiple integrated circuit packages can be fabricated at the same time. Typically, lead frames are constructed of either copper or a copper alloy material. The lead frame for the integrated circuit package 22 includes the terminals 26 and 28 connected to lead frame strip parts 62 and 64. The cross strips 66 and 68 support the integrated circuit during the encapsulation process. The rectangular-shaped broken line 70 is the outline where the cavity of the mold would be located during the encapsulation process. The four tabs, one shown as reference numeral 72, support the integrated circuit package after encapsulation, but are easily pulled and separated from the sides of the encapsulated device when it is desired to remove the integrated circuit package from the lead frame strip. The terminals of the package are cut from the lead frame strip at broken lines 74, whereupon the encapsulated integrated circuit package can be physically pushed down and removed from the lead frame strip.

With reference back to the construction of the lead frame 60, it is seen from FIG. 9 that the lead frame is formed with bifurcated fingers 76 and 78. Each finger member 76 and 78 has formed thereon a pedestal. The terminal 28 has formed at its end the pedestal finger 76. In like manner, the end of the lead frame terminal 26 has pedestal finger 78 formed at the end thereof. The pedestal fingers 76 and 78 are formed with essentially the same shape. Due to the manner in which the lead frames are etched, each finger 76 and 78 includes a pedestal for contact with a corresponding contact or contacts of the semiconductor chip 40. For example, the pedestal of finger 76 is soldered to the rectangular-shaped contact 50 of the chip 40, and the pedestal of finger 78 is soldered to the square contacts 52 and 54 of the chip 40. The semiconductor chip 40 is shown in phantom in FIGS. 10 and 11.

Figure 11:
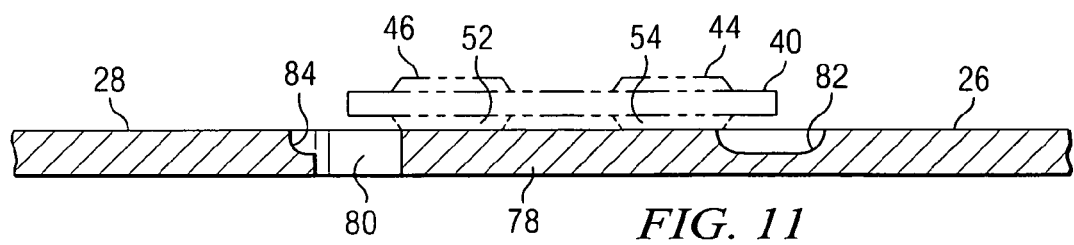
FIG. 11 is a cross-sectional view of the lead frame of FIG. 9, taken along line 11-11.

The openings in the lead frame 60 are formed by double sided etching of the lead frame material. In other words, the metal of the lead frame 60 is etched from both sides until the material is removed down to the center of the thickness of the lead frame. This is shown by the opening 80 (FIG. 11) which extends all the way through the lead frame 60. However, other areas on the top surface of the lead frame 60 are etched only from the top side so that the lead frame material is removed half way through the thickness of the lead frame 60. This is shown in FIGS. 9 and 11 at areas 82 and 84. It is the top-side etching of the lead frame half way through that forms the pedestal structure for the bifurcated fingers 76 and 78.

Figure 10:
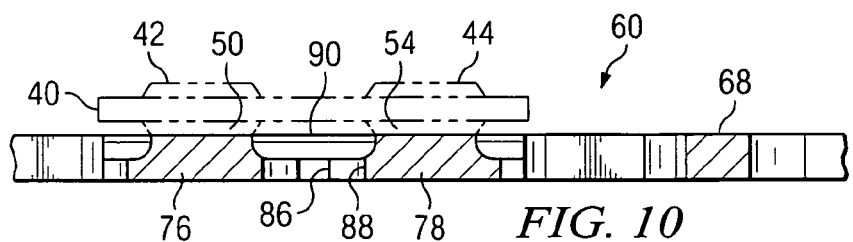
FIG. 10 is a cross-sectional view of the lead frame of FIG. 9, taken along line 10-10.

Both pedestal fingers 76 and 78 are shown in cross section in FIG. 10. The pedestal fingers 76 and 78 are spaced apart from each other by an elongate slot 86. The slot 86 is envisioned to be a space of about 3-10 mils between the pedestal fingers 76 and 78. If the slot 86 is too narrow, high voltages impressed across the terminals 26 and 28 could result in arcing, and the high electric fields could carbonize or otherwise damage the voltage variable material 58. If the slot 86 is too wide, the voltage at which the voltage variable material 58 breaks down could be too high to provide adequate protection. In the middle of the elongate slot 86 there is etched a circular opening 88. The circular opening 88 is larger in diameter than the space of the slot 86 between the pedestal fingers 76 and 78. In practice, the opening 88 could be a shape other than circular, such as oval, rectangular, diamond, etc. As will be described below, the opening 88 between the pedestal fingers 76 and 78 is used to fill a pocket with the voltage variable material 58. FIG. 10 shows the pocket 90 into which the voltage variable material 58 is injected so as to make physical contact between the pedestal fingers 76 and 78, and thus between the lead frame terminals 26 and 28.

In fabricating the ESD protected integrated circuit package 22 according to the invention, the following steps are carried out. A solder paste is placed on the surfaces of the pedestal fingers 76 and 78 of the lead frame 60. The semiconductor chip 40 is placed on the pedestal fingers 76 and 78 in the position shown in FIG. 4. Next, solder paste is placed on the surfaces of the top contacts 42, 44 and 46 of the chip 40. The preform 48 is aligned and placed on the top contacts 42, 44 and 46 of the chip 40. The entire lead frame 60 and assembled components are reflow soldered. The preform 48 is thus electrically connected and bonded to the semiconductor chip 40, and the chip 40 is electrically connected and bonded to the pedestal fingers 76 and 78 of the lead frame 60.

Figure 7:
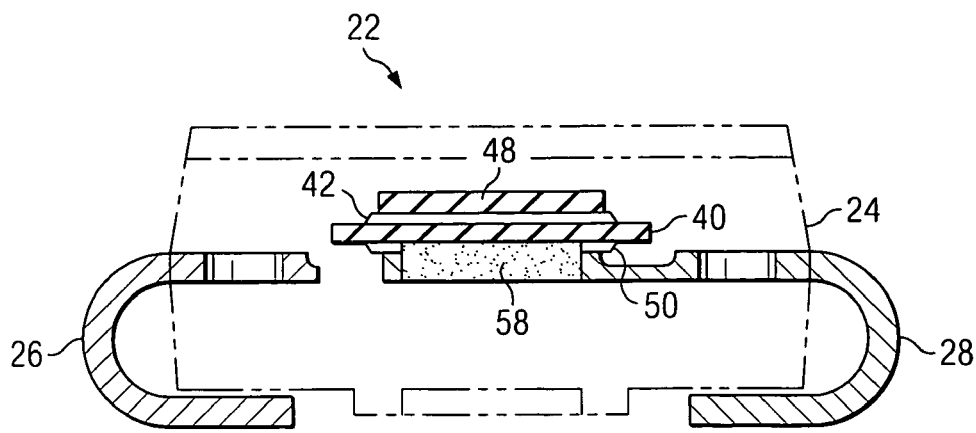
FIG. 7 is a cross-sectional view of the integrated circuit package of FIG. 4, taken along line 7-7.
Figure 8:
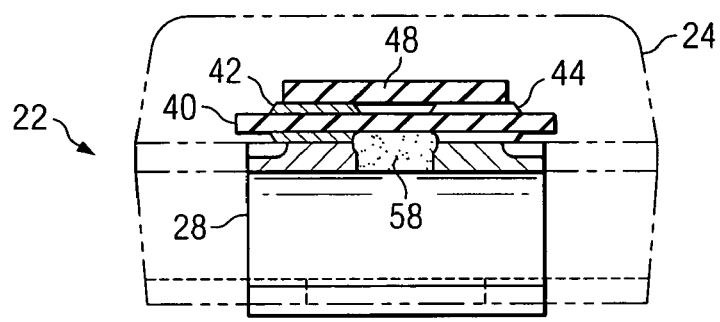
FIG. 8 is a cross-sectional view of the integrated circuit package of FIG. 4, taken along line 8-8, and showing the voltage variable material in the pocket formed between the semiconductor chip and the lead frame.
Figure 12:
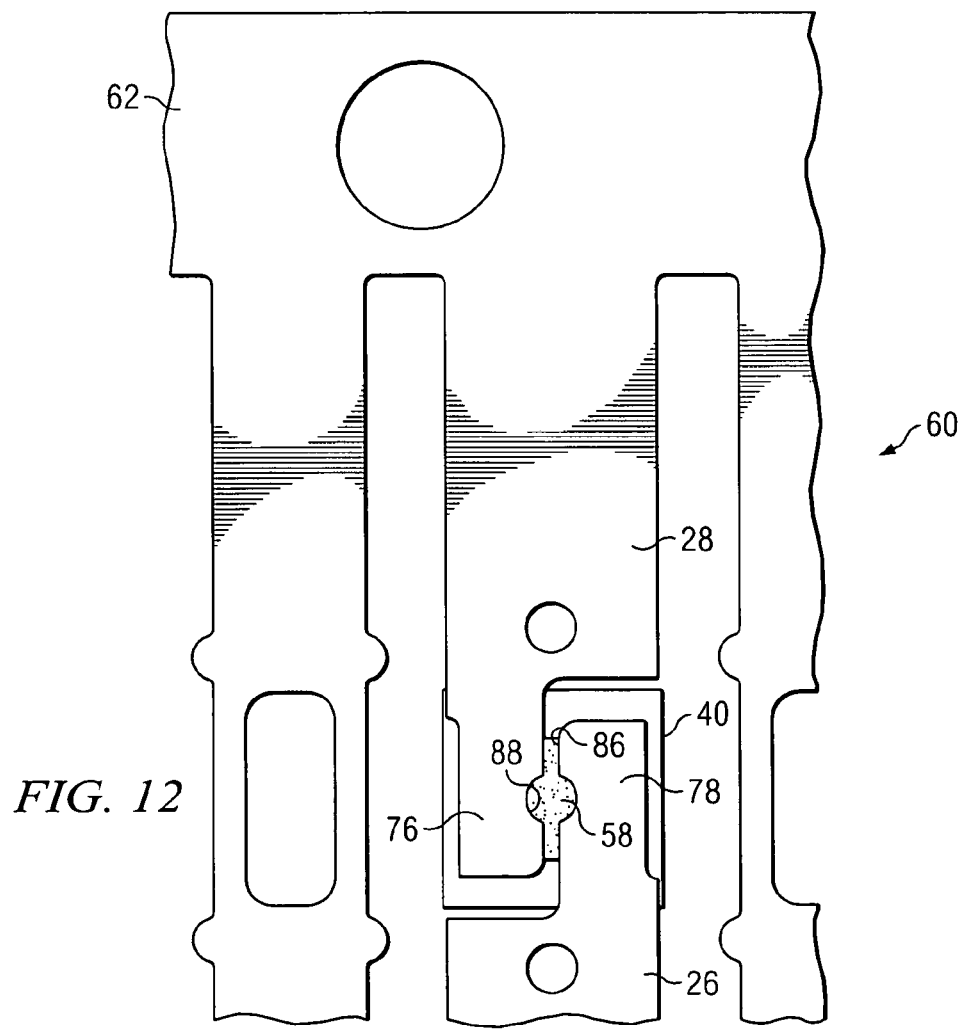
FIG. 12 is a view of a lead frame turned over so that a liquid voltage variable material can be injected in the opening between the bifurcated lead frame fingers.

Once the reflow solder process is completed, the entire lead frame 60 is turned upside down so that the bottom side of the lead frame 60 is exposed. This is shown in FIG. 12. The circular opening 88 in the lead frame 60 provides a point of entry of the voltage variable material 58. Initially, the voltage variable material 58 is in a liquid or paste form, much like the consistency of glue. The voltage variable material 58 is then injected into the opening 88 so that it fills the pocket 90 (FIG. 10). The injection of the voltage variable material 58 can be done with a syringe or a conduit connected to a reservoir of the VVM. When the pocket 90 is full, or after a specified volume of the voltage variable material 58 has been dispensed, the voltage variable material 58 can spread by gravity flow into the slot 86 between the pedestal fingers 76 and 7. This assures a physical contact of the voltage variable material 58 between the lead frame terminals 26 and 28. Preferably, the voltage variable material 58 does not protrude above the surface of the lead frame 60. It should be noted that the pocket 90 is not of a closed volume, but there exists exit channels for the voltage variable material 58 to be squeezed therein. For example, the voltage material 58 can be squeezed through the space near the chip 40 and between the bottom chip contacts. Thus, there are no captured pockets of air which would be pressurized if such volume were attempted to be displaced with the voltage variable material 58. This facilitates the flow of the voltage variable material 58 between the bottom chip contacts. Once the voltage variable material 58 has been deposited into the opening 88 of each lead frame of the strip, it is subjected to a curing process in an oven at a temperature of about 135° C. for about 30 to 45 minutes. Different curing profiles can be used for different types of voltage variable materials. The curing of the voltage variable material 58 hardens it without shrinking. Thus, the voltage variable material 58 maintains its physical, and thus electrical contact with the lead frame terminals 26 and 28. Transverse cross-sectional views of the cured voltage variable material are shown in FIGS. 7 and 8.

Figure 13:
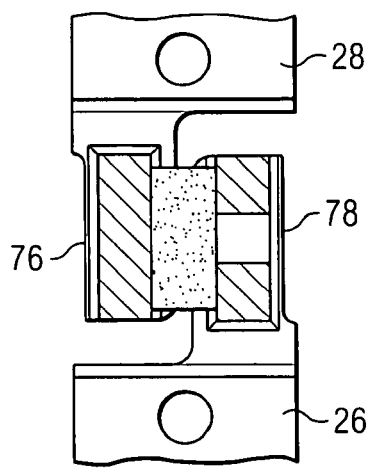
FIG. 13 is a portion of the lead frame showing the location of the deposited voltage variable material.

In accordance with an important feature of the invention, the voltage variable material 58 fills the enlarged pocket 90. FIG. 13 illustrates a top view of the pocket 90, with the semiconductor chip 40 removed for ease of understanding. The shaded area represents the voltage variable material 58. The cross-hatched areas of the pedestal fingers 76 and 78 illustrates the locations of contact with the semiconductor chip 40. As can be appreciated, the voltage variable material 58 is captured in the pocket 90. In addition, the voltage variable material 58 makes physical contact with the chip contacts 50, 52 and 54. Hence, even if a physical contact of the voltage variable material 58 fails between the lead frame terminals 26 and 28, there is yet the optional contact of the VVM 58 between the chip contacts themselves. Thus, there is double assurance that the voltage variable material 58 remains in physical and electrical contact between a conductor and ground to provide ESD protection to components externally connected to the integrated circuit package 22.

As noted in FIG. 12, the voltage variable material 58 is preferably forced into the slot 86 between the pedestal fingers 76 and 78. This allows for a path of any excess voltage variable material 58 injected into the opening 88. In addition, by providing at least two possible contact areas (in the slot 86) between the pedestal fingers 76 and 78, there remains the chance that the pedestal fingers 76 and 78 will remain in contact with the voltage variable material 58, even if one path becomes disconnected. In other words, one connection of the voltage material 58 exists on one side of the circular opening 88, and another connection exists between the pedestal fingers 76 and 78 on the other side of the circular opening 88. In the event that one connection between the pedestal fingers 76 and 78 is interrupted due to thermal changes, aging of the components, chemical reactions, etc., it is possible that the other connection between the pedestal fingers 76 and 78 remains intact. As noted above, even if both connections of the voltage variable material 58 between the pedestal fingers 76 and 78 becomes interrupted, there still remains the possibility that the voltage variable material 58 remains in electrical contact with the contacts 50, 52 and 54 of the semiconductor chip 40. The contact of the voltage variable material 58 indirectly contacts the lead frame fingers 76 and 78 through the chip contacts.

As noted above, the voltage variable material 58 is deposited so that it does not protrude above the surface of the lead frame 60. This is beneficial during the encapsulation stage when the encapsulant is forced into the mold under high pressure. The shearing force caused by the movement of the pressurized encapsulant through the mold is often a problem, in that obstructions in the way of the leading front of the encapsulant tend to be moved or become dislodged. For example, bonding wires between chip contacts and a lead frame can become disconnected as a result of such a molding process. In like manner, it is envisioned that if the hardened voltage variable material 58 were to protrude beyond the planar surface of the lead frame 60, it could be moved sufficiently by the shear forces of the encapsulant and disrupt the intimate contact of the VVM between the pedestal fingers 76 and 78. When the exposed surface of the voltage variable material 58 is coplanar or below the surface of the lead frame 60, the problem of shear forces generated during the encapsulation process is alleviated.

Continuing with the fabrication process, after the voltage variable material 58 is cured, the lead frame and components attached thereto are moved to an encapsulating process.

Conventional integrated circuit encapsulating processes involve the use of upper and lower mold halves that move together with the lead frame therebetween. The cavity of the mold closes over the semiconductor chip and a portion of the lead frame to be encapsulated. The cavity of the mold is located about the semiconductor circuit, as noted in the broken line 70 of FIG. 9. A liquefied encapsulant 24, such as plastic, epoxy-based material or other suitable encapsulant, is injected into the mold at a temperature of about 170° C.-180° C., and at a pressure of about 400 psi. The encapsulant 24 is allowed to set and harden. The encapsulated lead frame is then trimmed, in that the lead frame terminals 26 and 28 are cut from the elongated edge of the lead frame, at the location denoted by the broken line 74 of FIG. 9. The lead frame terminals 26 and 28 are then formed into the semicircular shape, as noted in FIG. 6, and as specified by the standards of the DO-214 package specification. Of course, the principles and concepts of the invention can be applied to many other integrated circuit package configurations, other than that described herein. The integrated circuit package 22 is then pushed down from the lead frame 60 and removed therefrom. As noted above, the tabs 72 of the transverse members 66 and 68 of the lead frame 60 are easily pulled away from their embedded positions in the edge of the encapsulated body of the integrated circuit package 22. Lastly, the terminals 26 and 28 are plated with a conductive material, such as solder.

The embodiment described above includes a semiconductor chip as a component to be used with the ESD protection device 34. However, the invention is not limited to such type of component, but can be used with other components such as integrated resistors, capacitors and other components adapted for manufacture by integrated circuit techniques. In addition, the components can be discrete components of many varieties mounted on a lead frame. Indeed, the lead frame can be employed with the voltage variable material without the use of a passive or active electrical component. Rather, the two-lead device could be for the specific purpose of providing only ESD protection to other circuits externally connected to the device. In this event, there would not be an electronic component attached to the lead frame, but perhaps a dummy component mounted to the lead frame to assist in forming the pocket for the voltage variable material. The dummy component could be the copper preform etched on the bottom surface thereof to form a concave part larger than the circular opening 88 in the lead frame.

From the foregoing, disclosed is method of utilizing a voltage variable material in the integrated circuit fabrication process for placement in a pocket formed between the semiconductor chip and the lead frame. An opening in the lead frame allows voltage variable material to be injected into the pocket to thereby place the voltage variable material in intimate contact with the two lead frame terminals, as well as in contact with the contacts on the bottom of the semiconductor chip. In the absence of an electrostatic discharge, the voltage variable material remains highly resistive. When the terminals of the integrated circuit are subject to an electrostatic discharge, the voltage variable material becomes conductive in a matter of picoseconds, thus protecting circuits connected to the package terminals from the harmful effects of the ESD energy. The process in which the voltage variable material is deposited into the pocket, prevents the VVM from protruding from the planar surface of the lead frame. This substantially reduces the possibility of the voltage variable material from being dislodged or otherwise disturbed during the encapsulation molding process. A more reliable device is thus achieved.

While the preferred and other embodiments of the invention have been disclosed with reference to specific integrated circuit package, it is to be understood that many changes in detail may be made as a matter of engineering choices without departing from the spirit and scope of the invention, as defined by the appended claims.

What is claimed is:

1. A packaged device, comprising:
    a lead frame having members providing a first terminal and a second terminal to said packaged device;
    a component mounted to said lead frame;
    said lead frame having an opening therein;
    a pocket formed between said component and said lead frame, said pocket being larger than said opening, and said opening is in communication with said pocket; and
    a voltage variable material injected into said pocket via said opening, said voltage variable material adapted for providing electrostatic discharge protection to circuits connected to said first and second terminals of said packaged device.

2. The packaged device of claim 1, wherein said opening in said lead frame is located on a bottom side of said packaged device.

3. The packaged device of claim 1, wherein said lead frame is constructed with spaced-apart finger members, and said opening comprises a widened area in the space between the finger members.

4. The packaged device of claim 3, wherein said opening is circular shaped.

5. The packaged device of claim 1, wherein said component comprises a semiconductor chip bonded to said lead frame.

6. The packaged device of claim 5, wherein said semiconductor chip includes contacts electrically bonded to said lead frame, and wherein a body of said semiconductor chip and said contacts form the pocket with said lead frame.

7. The packaged device of claim 5, wherein an overvoltage protection device is formed in said semiconductor chip.

8. The packaged device of claim 1, wherein said first terminal and said second terminal terminate outside an encapsulated part of said packaged device, and opposite ends of said first and second terminals terminate inside the packaged part, and wherein said opposite ends of said first and second terminals are spaced apart by a slot, and a longitudinal axis of said slot is aligned with a longitudinal axis of said first and second terminals.

9. The packaged device of claim 8, further including an opening between said opposite ends, said opening being larger that a distance of the slot between the opposite ends.

10. The packaged device of claim 9, wherein said voltage variable material is located in at least a portion of said slot and in at least a portion of said opening.

11. The packaged device of claim 10, wherein said opening is located centrally in said slot.

12. The packaged device of claim 8, wherein a portion of said pocket includes an etched edge of the lead frame forming said slot.

13. The packaged device of claim 5, wherein said semiconductor chip includes one or more contacts, and wherein said voltage variable material is in electrical contact with at least one contact of said semiconductor chip.

14. The packaged device of claim 1, further including an encapsulating material, and wherein said encapsulating material is in contact with said voltage variable material only in the opening of said lead frame.

15. A packaged device, comprising:
    a semiconductor chip having at least two contacts;

a voltage variable material adapted for providing electrostatic discharge protection to circuits connected to said packaged device;

a lead frame having two elongate members, each elongate member having an outer end defining a terminal of the packaged device for connection to other circuits, and each elongate member having an inner end for connection to a respective said semiconductor chip contact;

the inner ends of the respective elongate members defining respective fingers, and each said lead frame finger being spaced apart from each other by a slot, said slot having therein an opening for dispensing therethrough a liquefied form of said voltage variable material; and said voltage variable material filling a space formed by said semiconductor chip and said lead frame.

16. The packaged device of claim 15, wherein said space formed by said semiconductor chip and said lead frame is larger than a diameter of said opening between the lead frame fingers.

17. The packaged device of claim 15, wherein said lead frame fingers have respective edges etched to form a recessed area in said space.

18. The packaged device of claim 15, further including a moldable material encapsulating said semiconductor chip and said lead frame fingers, said moldable material contacting the voltage variable material only in the opening in said lead frame.

19. The packaged device of claim 15, wherein an overvoltage protection device is formed in said semiconductor chip.

20. A method of making a packaged device, comprising the steps of:

fastening a semiconductor chip to a lead frame;

injecting a voltage variable material through an opening in the lead frame into a pocket formed between the semiconductor chip and the lead frame, said voltage variable material of the type providing electrostatic discharge protection to circuits connected to the lead frame; and using a moldable material to encapsulate the semiconductor chip and a portion of the lead frame with the variable voltage variable material.

21. The method of claim 20, further including the steps of positioning the lead frame in a first orientation to fasten the semiconductor chip to said lead frame, and then inverting the lead frame to a second orientation to inject the voltage material into said pocket.

22. The method of claim 20, wherein said moldable material contacts the voltage variable material only in the opening in the lead frame.

23. The method of claim 20, further including injecting the voltage variable material into the opening of the lead frame after soldering the semiconductor chip to the lead frame.

* * * * *